(12) United States Patent
Tian et al.

(10) Patent No.: US 8,657,629 B2
(45) Date of Patent: Feb. 25, 2014

(54) SIM CARD SLOT HAVING A FOOL-PROOF FUNCTION AND ELECTRONIC APPARATUS CONTAINING THE SIM CARD SLOT

(75) Inventors: Xiyong Tian, Beijing (CN); Yangjian Hu, Beijing (CN); Yikai Zhang, Beijing (CN)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 101 days.

(21) Appl. No.: 13/405,666

(22) Filed: Feb. 27, 2012

(65) Prior Publication Data
US 2012/0231650 A1     Sep. 13, 2012

(30) Foreign Application Priority Data

Mar. 11, 2011 (CN) .......................... 2011 1 0059911

(51) Int. Cl.
    H01R 24/00       (2011.01)
(52) U.S. Cl.
    USPC .......................................................... 439/630
(58) Field of Classification Search
    USPC ................................................ 439/630, 633
    See application file for complete search history.

(56) References Cited

U.S. PATENT DOCUMENTS

| 4,780,603 | A | * | 10/1988 | Hamada | 235/492 |
| 4,864,116 | A | * | 9/1989 | Banjo et al. | 235/492 |
| 5,036,430 | A | * | 7/1991 | Hills | 361/679.31 |
| 5,483,422 | A | * | 1/1996 | Bowen et al. | 361/802 |
| 5,581,127 | A | * | 12/1996 | Shinohara | 257/679 |
| 5,969,331 | A | * | 10/1999 | Hoolhorst et al. | 235/486 |
| 6,050,492 | A |   | 4/2000 | Hoolhorst | |
| 6,068,516 | A | * | 5/2000 | Chang | 439/633 |
| 6,109,939 | A | * | 8/2000 | Kondo et al. | 439/140 |
| 6,234,845 | B1 | * | 5/2001 | Hakozaki | 439/633 |
| 6,264,483 | B1 | * | 7/2001 | Wilson | 439/137 |
| 6,402,529 | B2 | * | 6/2002 | Saito et al. | 439/74 |
| 6,478,630 | B1 | * | 11/2002 | Hsu | 439/680 |
| 6,513,722 | B1 | * | 2/2003 | Nakamura et al. | 235/492 |
| 6,652,299 | B2 | * | 11/2003 | Sato | 439/159 |
| 6,663,403 | B2 | * | 12/2003 | Hsu | 439/159 |
| 6,669,512 | B2 | * | 12/2003 | Lee | 439/630 |

(Continued)

OTHER PUBLICATIONS

International Preliminary Report on Patentability, corresponding to PCT/IB2012/000367, mailed Sep. 26, 2013.

(Continued)

*Primary Examiner* — Neil Abrams
(74) *Attorney, Agent, or Firm* — Renner, Otto, Boisselle & Sklar, LLP

(57) ABSTRACT

The embodiments of the present invention provide a SIM card slot having a fool-proof function and electronic apparatus containing the SIM card slot. The SIM card slot comprises: an accommodating space for accommodating the SIM card; and a cover, which may be of metal, positioned above the accommodating space; wherein a recessed zone is arranged in the cover, the recessed zone constituting a stopping sheet for blocking the insertion of the bevel edge of the SIM card. The wrong insertion of the SIM card of the electronic apparatus, such as a mobile terminal, may be prevented by the SIM card slot having a fool-proof function and electronic apparatus containing the SIM card slot of the present invention. Upon correct insertion the SIM card edge will cause the stopping sheet to be lifted, but with incorrect insertion the stopping sheet will engage the card bevel edge to block further insertion.

16 Claims, 6 Drawing Sheets

(56) References Cited

U.S. PATENT DOCUMENTS

| | | | |
|---|---|---|---|
| 6,799,724 B2 * | 10/2004 | Shimada et al. | 235/439 |
| 6,840,807 B2 * | 1/2005 | Ooya et al. | 439/630 |
| 6,843,670 B2 * | 1/2005 | Yamaguchi et al. | 439/159 |
| 6,851,959 B2 * | 2/2005 | Ooya et al. | 439/159 |
| 6,875,057 B2 * | 4/2005 | Miyazawa et al. | 439/630 |
| 6,905,369 B2 * | 6/2005 | Nakai et al. | 439/630 |
| 7,044,798 B2 * | 5/2006 | Takei et al. | 439/630 |
| 7,066,394 B2 * | 6/2006 | Kondo et al. | 235/492 |
| 7,238,052 B2 * | 7/2007 | Wang et al. | 439/630 |
| 7,255,604 B2 * | 8/2007 | Tanaka et al. | 439/630 |
| 7,267,561 B2 * | 9/2007 | Lai et al. | 439/138 |
| 7,326,085 B2 * | 2/2008 | Takai et al. | 439/630 |
| 7,364,820 B2 * | 4/2008 | Tanaka et al. | 439/633 |
| 7,384,294 B2 * | 6/2008 | Washino et al. | 439/326 |
| 7,438,600 B1 * | 10/2008 | Hung et al. | 439/630 |
| 7,862,381 B2 * | 1/2011 | Miller | 439/630 |
| 7,909,611 B2 * | 3/2011 | Miller | 439/60 |
| 8,152,541 B2 * | 4/2012 | Sakiyama et al. | 439/138 |
| 8,235,753 B2 * | 8/2012 | Tanaka et al. | 439/630 |
| 2004/0259426 A1 * | 12/2004 | Chang | 439/677 |
| 2009/0137139 A1 * | 5/2009 | Shiue et al. | 439/160 |
| 2012/0231650 A1 * | 9/2012 | Tian et al. | 439/374 |
| 2012/0329306 A1 * | 12/2012 | Little et al. | 439/367 |
| 2013/0237097 A1 * | 9/2013 | Nakamura | 439/633 |

OTHER PUBLICATIONS

International Search Report (Sep. 24, 2012) for corresponding International Application No. PCT/JP2006/307059.

Written Opinion (Sep. 24, 2012) for International Application No. PCT/JP2006/307059 dated Jul. 11, 2006.

* cited by examiner

SIM CARD SLOT HAVING A FOOL-PROOF FUNCTION AND ELECTRONIC APPARATUS CONTAINING THE SIM CARD SLOT

TECHNICAL FIELD

The present invention relates to a SIM (Subscriber Identity Module) card slot of electronic apparatus and in particular, to a SIM card slot having a fool-proof function and electronic apparatus containing the SIM card slot.

BACKGROUND ART

As electronic technologies and communication technologies rapidly develop, some electronic apparatus, such as a mobile terminal, has become an indispensable part of the daily lives of people. It has involved many functions, bringing much convenience to the lives and work of people. And at the same time, the mobile terminals have many design limits in realizing these functions and hence reduce the flexibility of the whole design of the mobile terminals.

Typically, a mobile terminal needs a SIM card to be inserted to fulfill the communication function of the mobile terminal and thus, a structure needs to be provided in the body of the mobile terminal to identify the SIM card, which is referred to as a SIM card slot in this invention. The SIM card slot has fool-proof design; however, it generally needs a specific accommodating space or another component to realize proper use.

FIG. 1A is a schematic diagram of the structure of a SIM card slot 1 of a mobile terminal. As shown in FIG. 1A, the SIM card slot 1 is provided on the body of the mobile terminal and contains an accommodating space 2 and a fixed structure 3, the thickness of the accommodating space being equivalent to that of the SIM card, and its bottom being its elastic (flexible or resilient) contacts 4 in contact with the metal chip terminals of the SIM card. When the SIM card is placed in the accommodating space 2, the upper surface of the SIM card is flush with the upper surface of the accommodating space. The fixed structure 3 is used for fixing (positioning) the SIM card. The fixed structure 3 may be a metal piece with one side being capable of being lifted and another side being fixed to one side of the accommodating space, or a metal piece with two sides being respectively fixed to two sides of the accommodating space, where the SIM card is inserted and taken out through the design of the battery slot, or a metal piece with three sides being respectively fixed to three sides of the accommodating space, where the SIM card is also inserted and taken out through the design of the battery slot. For the structure shown in FIG. 1A, the fool-proof design is generally to make the shape of the accommodating space 2 to be adapted for that of the SIM card 1 to prevent wrong insertion of the SIM card.

FIG. 1B is a schematic diagram of the structure of another SIM card slot 10 of a mobile terminal. As shown in FIG. 1B, the SIM card slot 10 comprises a bottom 11 and a top 12, the top being made of metal, and of which at least two sides being fixed together with the corresponding sides of the bottom to form an accommodating space 13 for accommodating the SIM card and for the insertion of the SIM card. Elastic contacts 14 of the mobile terminal are exposed through openings in the bottom. When the SIM card is correctly inserted into the accommodating space, its metal terminals are in contact with the elastic contacts 14. Some other openings 16 are provided in the top 12 to fulfill other functions. For the structure shown in FIG. 1B, the fool-proof design may be realized through a method in which identification of the correct direction for insertion is printed at a peripheral position of the SIM card slot 10 of the mobile phone.

The fool-proof design of the SIM card slot 1, 10 shown in FIGS. 1A and 1B needs either a specific accommodating space, or additional identification, increasing manufacture cost and process.

SUMMARY OF THE INVENTION

The present invention is proposed directed to the above problems in the prior art.

The present invention is addressed to provide a SIM card slot having a fool-proof function and electronic apparatus containing the SIM card slot, providing a brand new solution for the SIM card slot of electronic apparatus to prevent wrong insertion of the SIM card.

According to a first aspect of the present invention, there is provided a SIM card slot, comprising:

an accommodating space for accommodating the SIM card, the bottom of the accommodating space being provided with an open, from which a SIM card identifying terminal arranged on a circuit board of the electronic apparatus being exposed; and a metal patch (also referred to below as "cover") positioned above the accommodating space;

wherein a recessed zone is arranged in the metal patch, the recessed zone constituting a stopping sheet for blocking the insertion of the bevel edge of the SIM card.

According to a second aspect of the present invention, there is provided a SIM card slot as described in the first aspect, wherein the recessed zone is formed by a punch process.

According to a third aspect of the present invention, there is provided a SIM card slot as described in the first aspect, wherein the accommodating space is constituted by an independent SIM card seat structure, or constituted by a recessed structure on the body of the electronic apparatus.

According to a fourth aspect of the present invention, there is provided a SIM card slot as described in the first aspect, wherein the fixed end of the stopping sheet is spaced apart at a certain distance from an edge of the metal patch which is in parallel with the insertion path.

According to a fifth aspect of the present invention, there is provided a SIM card slot as described in the first aspect, wherein the distance between the free end of the stopping sheet and an edge of the metal patch which is in parallel with the insertion path is less than or equal to the projection distance of the fool-proof angle of the SIM card in the direction perpendicular to the insertion path.

According to a sixth aspect of the present invention, there is provided a SIM card slot as described in the first aspect, wherein the stopping sheet is in a shape of trapezoid, the lower bottom of the trapezoid being the fixed end of the stopping sheet, and the upper bottom of the trapezoid being the free end of the stopping sheet.

According to a seventh aspect of the present invention, there is provided a SIM card slot as described in the first aspect, wherein the stopping sheet is one piece or two pieces in symmetry.

According to an eighth aspect of the present invention, there is provided electronic apparatus, comprising a SIM card identifying terminal arranged on a circuit board of the electronic apparatus and a SIM card slot arranged above the SIM card identifying terminal, the SIM card slot being used for the insertion of the SIM card, and the SIM card being in contact with the identifying terminal after being inserted into the SIM card slot, wherein the SIM card slot comprises:

an accommodating space for accommodating the SIM card, the bottom of the accommodating space being provided with an open, from which the SIM card identifying terminal arranged on the circuit board of the electronic apparatus being exposed; and a metal patch positioned above the accommodating space;

wherein a recessed zone is arranged in the metal patch, the recessed zone constituting a stopping sheet for blocking the insertion of the bevel edge of the SIM card.

According to a ninth aspect of the present invention, there is provided electronic apparatus as described in the eighth aspect, wherein the recessed zone is formed by a punch process.

According to a tenth aspect of the present invention, there is provided electronic apparatus as described in the eighth aspect, wherein the accommodating space is constituted by an independent SIM card seat structure, or constituted by a recessed structure on the body of the electronic apparatus.

According to an eleventh aspect of the present invention, there is provided electronic apparatus as described in the eighth aspect, wherein the fixed end of the stopping sheet is spaced apart at a certain distance from an edge of the metal patch which is in parallel with the insertion path.

According to a twelfth aspect of the present invention, there is provided electronic apparatus as described in the eighth aspect, wherein the distance between the free end of the stopping sheet and an edge of the metal patch which is in parallel with the insertion path is less than or equal to the projection distance of the fool-proof angle of the SIM card in the direction perpendicular to the insertion path.

According to a thirteenth aspect of the present invention, there is provided electronic apparatus as described in the eighth aspect, wherein the stopping sheet is in a shape of trapezoid, the lower bottom of the trapezoid being the fixed end of the stopping sheet, and the upper bottom of the trapezoid being the free end of the stopping sheet.

According to a fourteenth aspect of the present invention, there is provided electronic apparatus as described in the eighth aspect, wherein the stopping sheet is one piece or two pieces in symmetry.

In accordance with the SIM card slot having a fool-proof function and electronic apparatus containing the SIM card slot of the present invention, the wrong insertion of the SIM card of the electronic apparatus, such as a mobile terminal, can be prevented.

These and further aspects and features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

Many aspects of the invention can be better understood with reference to the following drawings. The components in the drawings are not necessarily to scale, emphasis instead being placed upon clearly illustrating the principles of the present invention. To facilitate illustrating and describing some parts of the invention, corresponding portions of the drawings may be exaggerated in size, e.g., made larger in relation to other parts than in an exemplary device actually made according to the invention. Elements and features depicted in one drawing or embodiment of the invention may be combined with elements and features depicted in one or more additional drawings or embodiments. Moreover, in the drawings, like reference numerals designate corresponding parts throughout the several views and may be used to designate like or similar parts in more than one embodiment.

DESCRIPTION OF THE DRAWINGS

The drawings are included to provide further understanding of the present invention, which constitute a part of the specification and illustrate the preferred embodiments of the present invention, and are used for setting forth the principles of the present invention together with the description. The same element is represented with the same reference number throughout the drawings. In the drawings.

DETAILED DESCRIPTION OF THE INVENTION

The interchangeable terms "electronic apparatus" and "electronic device" include portable radio communication apparatus. The term "portable radio communication apparatus", which hereinafter is referred to as a "mobile terminal", "portable electronic device", or "portable communication device", comprises all apparatuses such as mobile telephones, pagers, communicators, electronic organizers, personal digital assistants (PDAs), smartphones, portable communication devices or the like.

In the present application, embodiments of the invention are described primarily in the context of a portable electronic device in the form of a mobile telephone (also referred to as "mobile phone"). However, it shall be appreciated that the invention is not limited to the context of a mobile telephone and may relate to any type of appropriate electronic apparatus having the function of photographing and sound recording.

The preferred embodiments of the present invention are described as follows in reference to the drawings.

Figure 1A:
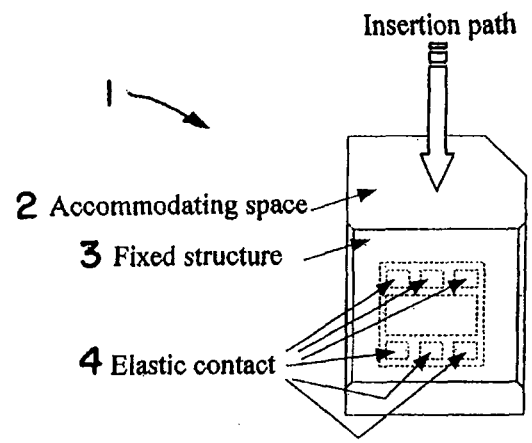
FIGS. 1A and 1B are schematic diagrams of the structure of the SIM card slot of an existing mobile terminal.
Figure 1B:
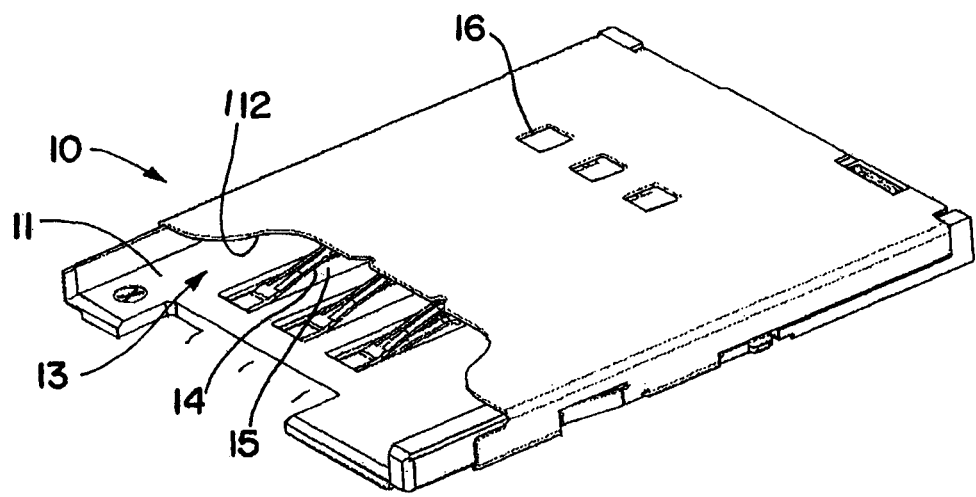
Figure 2:
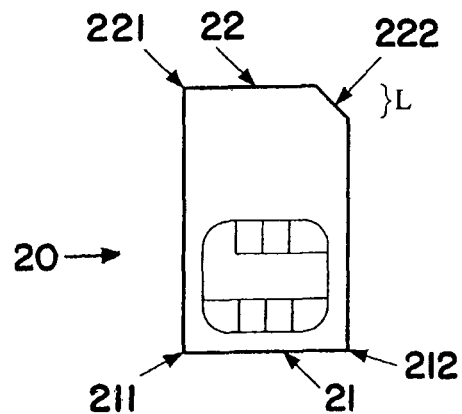
FIG. 2 is a schematic diagram of an existing SIM card.

A SIM (Subscriber Identity Module) card, also referred to as an intelligent card or a subscriber identity identifying card, stores such contents in a computer chip as information on a subscriber, an encryption key and the directory of the subscriber, etc., for the network to identify the identity of the subscriber, and encrypts the voice information of the subscriber in a call. It can be seen that a SIM card has become a necessary device for electronic apparatus in normal communication or data access. FIG. 2 is a schematic diagram of a standard SIM card, in which an edge 21 of the SIM card away from the fool-proof angle is referred to as a right angle edge for the convenience of description, the right angle edge 21 having two right angle ends 211 and 212. An edge of the SIM card adjacent to the fool-proof angle is referred to as a fool-proof angle edge 22, the fool-proof angle edge 22 having a right angle end 221 and a fool-proof angle end 222 (the edge of which sometimes being referred to as a bevel edge). As is illustrated in FIG. 2, relative to the linear extent of the fool-proof angle edge 22 from the right angle end 221, the fool-proof angle end 222 (or bevel edge) extends at the mentioned fool-proof angle.

Figure 3:
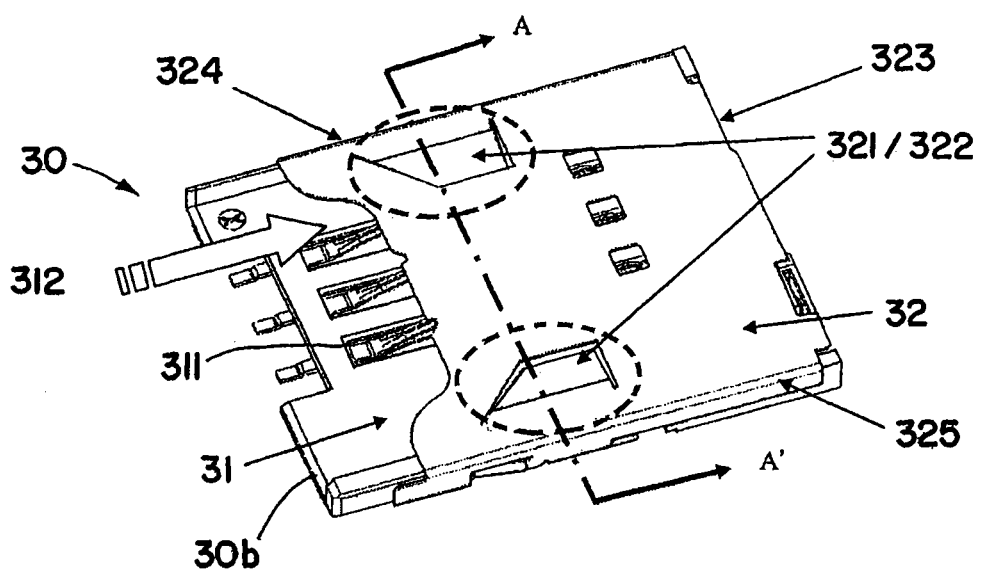
FIG. 3 is a schematic diagram of the structure of the SIM card slot of the present invention.

FIG. 3 is a schematic diagram of the structure of a SIM card slot 30 provided according to an embodiment of the present invention. Referring to FIG. 3, the SIM card slot comprises:

an accommodating space 31 for accommodating the SIM card, the bottom 30b of the accommodating space being provided with one or more openings (as illustrated), from which SIM card identifying terminals arranged on a circuit board of the electronic apparatus are exposed; and a metal cover 32 positioned above the accommodating space 31;

wherein a recessed zone 321 is arranged in the metal cover 32, the recessed zone 321 constituting a stopping sheet 322 for blocking the insertion of the bevel edge of the SIM card.

In this embodiment, the recessed zone 321 may be formed by a punch process, and may also be formed by other processes, and this embodiment is not limited thereto.

In this embodiment, the accommodating space 31 is of a SIM card seat (also referred to as support) structure with the shape corresponding to that of the SIM card and the height corresponding to the thickness of the SIM card, with openings 311 being provided in its bottom 30b for exposing a SIM card identifying terminal arrangement on a circuit board of the electronic apparatus. However, this embodiment is not limited thereto. For example, the accommodating space 31 may be an open space directly provided at the back of the body of the SIM card, with the shape of the open space corresponding to that of the SIM card, the thickness of the open space corresponding to that of the SIM card, and the bottom of the open space being the SIM card identifying terminal on a circuit board of the electronic apparatus. The accommodating space 31 has an insertion path 312 for the insertion of the SIM card.

In this embodiment, the metal cover 32 may be fixed to one edge of the accommodating space 31 by one edge, such as edge 323, to two edges of the accommodating space 31 by two edges, such as edges 324 and 325, and to three edges of the accommodating space 31 by three edges, such as edges 323, 324 and 325, however, this embodiment is not limited thereto. This embodiment is not limited to the manner of fixing the metal cover 32 to an edge of the accommodating space of the SIM card slot, and any exist manners of fixing the metal cover of the SIM card to an edge of the accommodating space of the SIM card slot may be applicable to the present invention. It should be understood by those skilled in the art that any existing or future other appropriate manners of fixing may be applicable to the present invention.

In this embodiment, it is normal insertion when the SIM card is inserted into the SIM card slot at its right angle edge 21 (shown in FIG. 2), and it is wrong insertion when the SIM card is inserted into the SIM card slot at its fool-proof angle edge 22 (FIG. 2). In order to prevent the wrong insertion of the SIM card, a recessed zone 321 is formed in the metal cover 32 by a punch process in this embodiment, the recessed zone 321 forming a stopping sheet 322. The stopping sheet 322 may prevent the SIM card from being inserted at its fool-proof angle edge, thereby enabling the SIM card to be smoothly inserted at its right angle edge.

With the structure shown in FIG. 3, the SIM card may be smoothly inserted into the SIM card slot 30 when the SIM card is correctly inserted into the SIM card slot; while the SIM card is blocked when the SIM card is wrongly inserted into the SIM card slot, thereby preventing the wrong operation resulting from the wrong insertion of the SIM card.

Figure 4A:
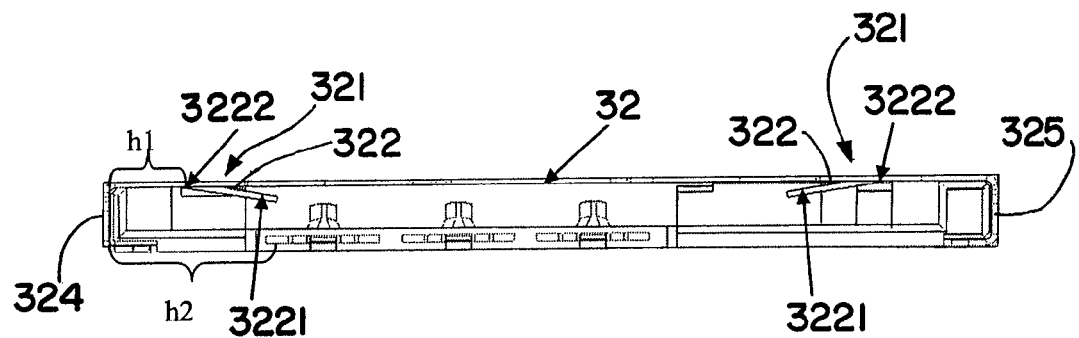
FIGS. 4A-4C are views showing the details of the SIM card slot shown in FIG. 3.
Figure 4B:
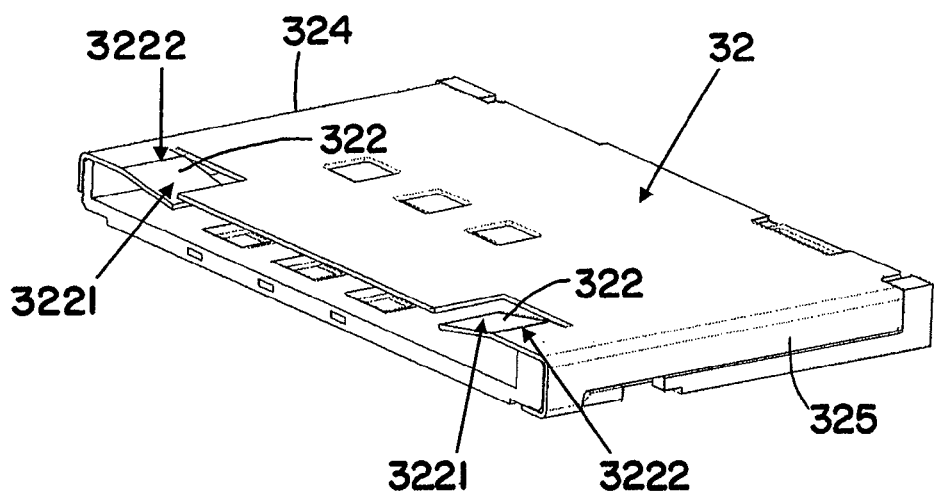
Figure 4C:
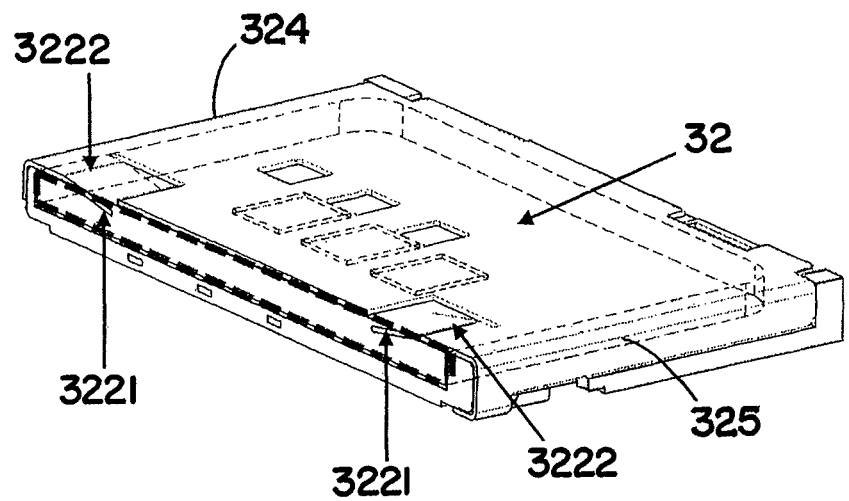

FIGS. 4A-4C are views showing the details of the SIM card slot 30 shown in FIG. 3, wherein FIG. 4A is a sectional view of the SIM card slot of FIG. 3 in the A-A' direction, FIG. 4B is a perspective view of the SIM card slot of FIG. 3 in the A-A' direction, and FIG. 4C is a perspective view of the SIM card slot of FIG. 3 in the A-A' direction, in which the dashed lines showing the schematic diagrams of the positions of the SIM card.

As shown in FIGS. 4A-4C, a free end 3221 of the stopping sheet 322 formed by a punch process in the metal cover 32 is lower than the upper surface of the metal cover 32, and a fixed end 3222 of the stopping sheet 322 is spaced apart from an edge of the accommodating space 31 at a distance h1. Hence, when the SIM card is inserted in a correct manner into the accommodating space 31 from the insertion path 312 (shown in FIG. 3), i.e. being inserted into the accommodating space 31 at its right angle edge 21 (FIG. 2) from the insertion path, the two ends 211, 212 of the right angle edge 21 are close to two edges of the accommodating space 31, and the SIM card is inserted smoothly. When the SIM card is inserted in a wrong manner into the accommodating space 31 from the insertion path, i.e. being inserted into the accommodating space 31 at its fool-proof angle edge 22 first along the insertion path 312, the right angle end 221 of the fool-proof angle edge 22 may be passed smoothly, but the fool-proof angle end of the fool-proof angle edge 223 is blocked because of being unable to enter directly from the edge of the accommodating space. Thus, this functions as preventing the wrong insertion of the SIM card, thereby preventing the wrong operation resulting from the wrong insertion of the SIM card.

In this embodiment, the fixed end 3222 of the stopping sheet 322 is spaced apart a distance h1 from an edge 324 (or 325) of the metal cover 32 that extends in parallel with the insertion path 312 (FIG. 3) The distance h2 between the free end 3221 of the stopping sheet 322 and an edge 324 (or 325) of the metal cover 32 which is in parallel with the insertion path 312 (FIG. 3) is less than or equal to the projection distance of the fool-proof angle of the SIM card in the direction perpendicular to the insertion path, i.e. the distance L shown in FIG. 2. The above two conditions may be met at the same time, or only one of them is met, and the present invention is not only limited thereto.

In this embodiment, the stopping sheet 322 may be only a single one and be provided at a side of the metal cover 32, such as either one of the two stopping sheets 322 shown in FIG. 3. It is possible for a user to insert a SIM card in a wrong insertion direction while it is not easy for him to mistake the front and back sides, since the front side of a SIM card differs from the back side, so only one stopping sheet is needed. Alternatively, two stopping sheets 322 may be two and provided in symmetry as shown in FIG. 3. Thus, no matter the direction is wrong or the sides are wrong when a user inserts a SIM card, the wrong insertion of the SIM card may be prevented by the structure of this embodiment.

The schematic diagram of FIG. 3 is shown taking that the stopping sheet is of a trapezoidal shape as an example. However, this embodiment is not limited thereto. For example, the shape of the stopping sheet may be another trapezoid, or a rectangle, or any other shapes, so long as one or both of the above conditions of a fixed end and a free end is/are met.

In order to make the advantage of the SIM card slot 30 of the embodiment shown in FIG. 3 to be more clear, the structure of the SIM card slot of the embodiment shown in FIG. 3 will be further described here below with reference to the schematic diagram of FIGS. 5A-5D showing the state of the SIM card being inserted into the SIM card slot.

In the following, two stopping sheets 322 formed by a punch process are taken as an example.

Figure 5A:
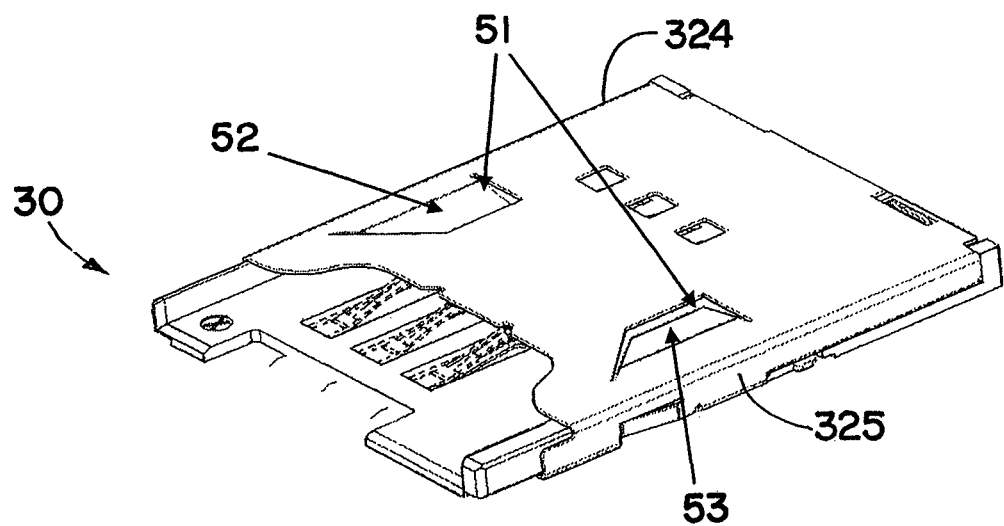
FIGS. 5A-5D are schematic diagrams of the operational states of the SIM card slot of the present invention.

FIG. 5A is a schematic diagram showing a normal state of the SIM card slot 30 of this embodiment. As shown in FIG. 5, a recessed zone 51 is formed by applying a force on the metal cover of the SIM card slot through a punching process, the recessed zone 51 forming stopping sheets 52 and 53.

Figure 5B:
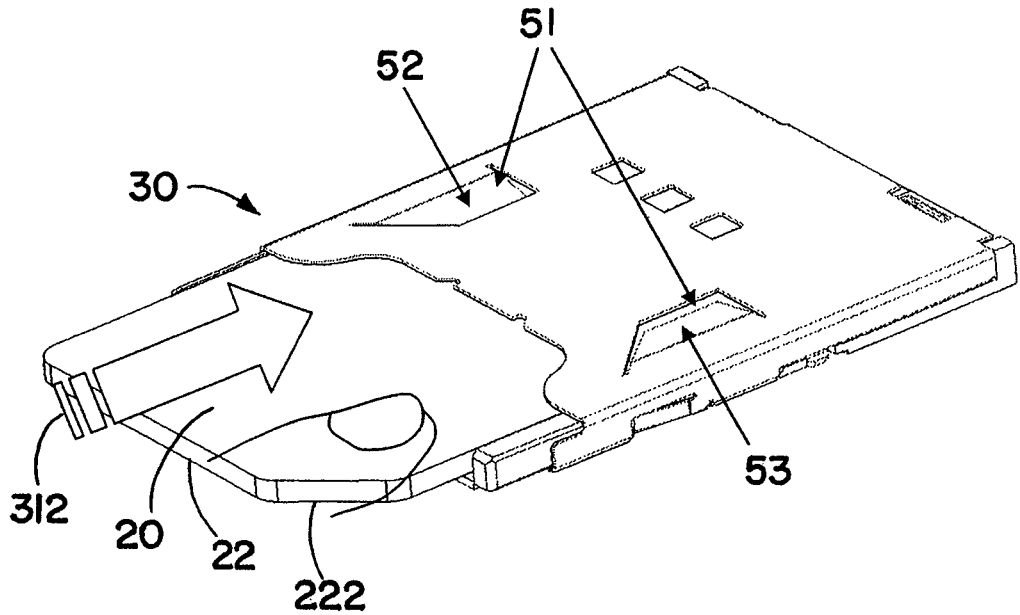

FIG. 5B is a schematic diagram showing that the SIM card 20 is inserted in a correct direction. As shown in FIG. 5B, the fool-proof angle 222 of the SIM card 20 is positioned at the bottom right of the insertion path 312 of the SIM card slot. Since it is inserted at the right angle edge 21 of the SIM card, the stopping sheets 52 and 53 are lifted up by the SIM card, thereby the SIM card being inserted successfully.

Figure 5C:
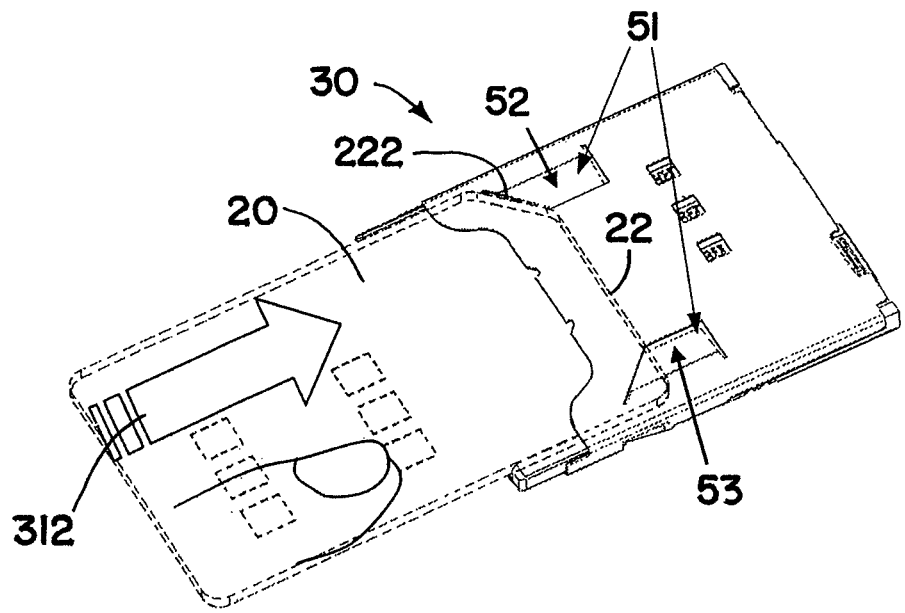

FIG. 5C is a schematic diagram showing that the SIM card 20 is inserted in a wrong direction. As shown in FIG. 5C, the fool-proof angle 222 of the SIM card 20 is positioned at the top left of the insertion path 312 of the SIM card slot 30. Since it is inserted at the fool-proof angle edge 22 of the SIM card 20, the stopping sheet 52 will block the fool-proof angle end 222 of the fool-proof angle edge 22 of the SIM card, resulting in that the SIM card cannot be inserted successfully, thereby functioning as preventing the wrong insertion of the SIM card.

Figure 5D:
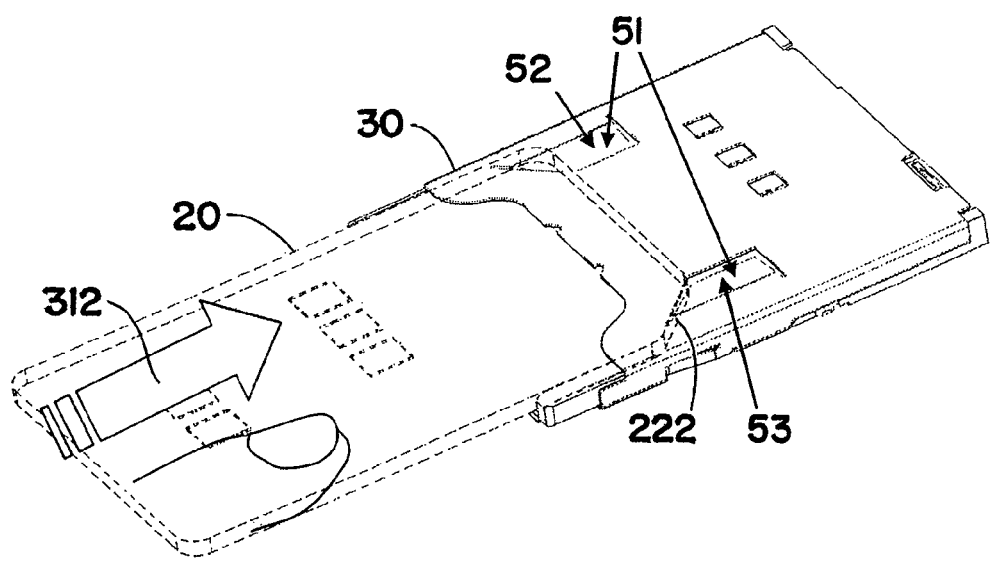

FIG. 5D is a schematic diagram showing that the SIM card 20 is inserted in a wrong direction. As shown in FIG. 5D, the fool-proof angle 222 of the SIM card is positioned at the top right of the insertion path 312 of the SIM card slot 30. Since it is inserted at the fool-proof angle edge 22 of the SIM card 20, the stopping sheet 53 will block the fool-proof angle end 222 of the fool-proof angle edge 22 of the SIM card, resulting in that the SIM card cannot be inserted successfully, thereby functioning as preventing the wrong insertion of the SIM card.

The SIM card slot of the present invention may prevent the wrong insertion of the SIM card only if a recessed zone is punched in the metal cover to form stopping sheets, which function as preventing the wrong insertion of the SIM card, without increasing manufacture cost, needing no change of design, and increasing the fixing pressure for the SIM card.

According to another embodiment of the present invention, there is provided electronic apparatus, besides its original components and functions, the electronic apparatus comprising: a SIM card identifying terminal arranged on a circuit board of the electronic apparatus; and a SIM card slot arranged above the SIM card identifying terminal, the SIM card slot being used for the insertion of the SIM card, and the SIM card being in contact with the identifying terminal after being inserted into the SIM card slot, wherein the SIM card slot comprises:

an accommodating space for accommodating the SIM card, the bottom of the accommodating space being provided with an open, from which the SIM card identifying terminal arranged on the circuit board of the electronic apparatus being exposed; and a metal cover positioned above the accommodating space;

wherein a recessed zone is arranged in the metal cover, the recessed zone constituting a stopping sheet for blocking the insertion of the bevel edge of the SIM card;

wherein the recessed zone is formed by a punch process, or may be formed by other applicable processes, but the present invention is not limited thereto;

wherein the accommodating space is constituted by an independent SIM card seat structure, or constituted by a recessed structure on the body of the electronic apparatus;

wherein the fixed end of the stopping sheet is spaced apart at a certain distance from an edge of the metal cover which is in parallel with the insertion path;

wherein the distance between the free end of the stopping sheet and an edge of the metal cover which is in parallel with the insertion path is less than or equal to the projection distance of the fool-proof angle of the SIM card in the direction perpendicular to the insertion path;

wherein the stopping sheet is in a shape of trapezoid, the lower bottom of the trapezoid being the fixed end of the stopping sheet, and the upper bottom of the trapezoid being the free end of the stopping sheet; and wherein the stopping sheet is one piece or two pieces in symmetry.

The SIM card slot of the electronic apparatus of this embodiment may be realized in the manners as shown in FIGS. 3, 4A-4C and 5A-5D. The SIM card slot has been described in detail in the above embodiments, and shall not be described any further.

The electronic apparatus of this embodiment may be such devices having a SIM card slot as a mobile phone, etc.

The electronic apparatus of the present embodiment has the SIM card slot of this embodiment, which may prevent the wrong insertion of the SIM card, and functions as preventing the wrong insertion of the SIM card, without increasing manufacture cost, needing no change of design, and increasing the fixing pressure for the SIM card.

The preferred embodiments of the present invention have been described above with reference to the accompanying drawings. The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

The invention claimed is:

1. A subscriber identity module (SIM) card slot, comprising:

an accommodating space for accommodating a SIM card that has a bevel edge, the bottom of the accommodating space being provided with an opening from which a SIM card identifying terminal arranged on a circuit board of electronic apparatus may be exposed; and a cover above the accommodating space;

wherein a recessed zone is arranged in the cover, the recessed zone comprising a stopping sheet for blocking the insertion of the bevel edge of the SIM card.

2. The SIM card slot according to claim 1, wherein the cover is metal and the recessed zone is formed by a punch process.

3. The SIM card slot according to claim 1, wherein the accommodating space comprises an independent SIM card support structure, or comprising a recessed structure on the body of the electronic apparatus.

4. The SIM card slot according to claim 1, wherein the cover is metal, the stopping sheet has a fixed end attached to the metal cover, and the fixed end of the stopping sheet is spaced apart at a certain distance from an edge of the metal cover which is in parallel with the insertion path of a SIM card into the SIM card slot.

5. The SIM card slot according to claim 1, wherein the stopping sheet has a free end that is not attached to the cover, and the distance between the free end of the stopping sheet and an edge of the cover which is in parallel with the insertion path of a SIM card into the SIM card slot is less than or equal to the projection distance of a fool-proof angle of the SIM card in the direction perpendicular to the insertion path.

6. The SIM card slot according to claim 1, wherein the stopping sheet has a fixed end attached to the cover and a free end that is not attached to the cover, the stopping sheet is in a shape of trapezoid, the lower bottom of the trapezoid being the fixed end of the stopping sheet, and the upper bottom of the trapezoid being the free end of the stopping sheet.

7. The SIM card slot according to claim 1, wherein the stopping sheet is one piece or two pieces in symmetry.

8. Electronic apparatus, comprising a SIM card identifying terminal arranged on a circuit board of the electronic apparatus and a SIM card slot arranged above the SIM card identifying terminal, the SIM card slot being used for the insertion of the SIM card, and the SIM card being in contact with the identifying terminal after being inserted into the SIM card slot, wherein the SIM card slot comprises:
   an accommodating space for accommodating the SIM card, the bottom of the accommodating space having an opening from which the SIM card identifying terminal arranged on the circuit board of the electronic apparatus is exposed; and
   a cover positioned above the accommodating space;
   wherein a recessed zone is arranged in the cover, the recessed zone comprising a stopping sheet for blocking the insertion of the bevel edge of the SIM card.

9. The electronic apparatus according to claim 8, wherein the cover is metal and the recessed zone is formed by a punch process.

10. The electronic apparatus according to claim 8, wherein the accommodating space comprises an independent SIM card support structure, or comprises a recessed structure on the body of the electronic apparatus.

11. The electronic apparatus according to claim 8, wherein the stopping sheet has a fixed end attached to the cover, and the fixed end of the stopping sheet is spaced apart at a certain distance from an edge of the cover which is in parallel with the insertion path of a SIM card into the SIM card slot.

12. The electronic apparatus according to claim 8, wherein the stopping sheet has a free end that is not attached to the cover, and the distance between the free end of the stopping sheet and an edge of the cover which is in parallel with the insertion path of a SIM card into the SIM card slot is less than or equal to the projection distance of a fool-proof angle of the SIM card in the direction perpendicular to the insertion path.

13. The electronic apparatus according to claim 8, wherein the stopping sheet has a fixed end attached to the cover and a free end that is not attached to the cover, the stopping shape is in a shape of trapezoid, the lower bottom of the trapezoid being the fixed end of the stopping sheet, and the upper bottom of the trapezoid being the free end of the stopping sheet.

14. The electronic apparatus according to claim 8, wherein the stopping sheet is one piece or two pieces in symmetry.

15. The SIM card slot according to claim 1, wherein the cover is a metal cover.

16. The electronic apparatus according to claim 8, wherein the cover is a metal cover.

* * * * *